(12) United States Patent
Fukunaga et al.

(10) Patent No.: US 6,776,919 B2
(45) Date of Patent: Aug. 17, 2004

(54) METHOD AND APPARATUS FOR ETCHING RUTHENIUM FILMS

(75) Inventors: Akira Fukunaga, Tokyo (JP); Haruko Ohno, Tokyo (JP); Ichiro Katakabe, Tokyo (JP); Sachiko Kihara, Tokyo (JP)

(73) Assignee: Ebara Corporation, Tokyo (JP)

( * ) Notice: Subject to any disclaimer, the term of this patent is extended or adjusted under 35 U.S.C. 154(b) by 303 days.

(21) Appl. No.: 09/988,719

(22) Filed: Nov. 20, 2001

(65) Prior Publication Data

US 2002/0060202 A1 May 23, 2002

(30) Foreign Application Priority Data

Nov. 22, 2000 (JP) .......................................... 2000-356589

(51) Int. Cl.[7] .......................... B44C 1/22; C03C 15/00; C03C 25/68; C23F 1/00; C25F 3/00
(52) U.S. Cl. ........................ 216/100; 438/745; 438/754
(58) Field of Search .................... 216/96, 100; 438/745, 438/754

(56) References Cited

U.S. PATENT DOCUMENTS 6,143,192 A * 11/2000 Westmoreland ............. 216/101
6,436,723 B1 * 8/2002 Tomita et al. .................. 438/3

* cited by examiner

Primary Examiner—Gregory Mills
Assistant Examiner—Roberts Culbert
(74) Attorney, Agent, or Firm—Wenderoth, Lind & Ponack L.L.P.

(57) ABSTRACT

There is provided a method and apparatus for etching a ruthenium film which can sufficiently etch away a ruthenium film formed on or adhering to the peripheral region, especially a no-device-formed region, backside or other portions of a substrate. The method comprises etching a ruthenium film formed on a substrate with a chemical liquid having a pH of not less than 12 and an oxidation-reduction potential of not less than 300 mVvsSHE.

11 Claims, 6 Drawing Sheets

METHOD AND APPARATUS FOR ETCHING RUTHENIUM FILMS

BACKGROUND OF THE INVENTION

1. Field of the Invention

This invention relates to a method and an apparatus for etching a ruthenium film, and more particularly to a method and an apparatus for etching a ruthenium film that is useful for etching away an unnecessary ruthenium film formed on or adhering to the peripheral region, backside or other portions of a substrate, such as a semiconductor wafer.

2. Description of the Related Art

In recent years, metals of the platinum group or their oxides have become candidates for an electrode material for use in forming a capacitor, which utilizes a high dielectric or ferroelectric material, on a semiconductor substrate. Among these metals ruthenium, because of its good film-forming properties, is being progressively studied as a feasible material A ruthenium film can be formed on a substrate generally by sputtering or CVD. In either method, a ruthenium film is formed onto the entire surface of a substrate, including the peripheral region. As a result, a ruthenium film is formed also in the peripheral region of the substrate and, in addition, the backside of the substrate is unavoidably contaminated with ruthenium.

The ruthenium film formed on or adhering to the peripheral region or backside of a substrate (i.e., the no-device-formed region of the substrate) is not only unnecessary, but can also cause cross-contamination during later transportation, storage and various processing steps of the substrate. Therefore, the performance of a dielectric material can be lowered. Accordingly, after performing some treatments during the film-forming process or to the formed ruthenium film, it is necessary to completely remove the unnecessary ruthenium film. Further, in the case of using ruthenium as an electrode material for forming a capacitor, a step for removing part of a ruthenium film formed on the interconnection formed region of a substrate is needed.

However, a technique has not been developed yet which can remove an unnecessary ruthenium film formed on or adhering to a substrate or the like by wet etching. This is partly because ruthenium is a very stable substance, and cannot be etched even with a metal-etching agent such as nitric acid and aqua regia.

SUMMARY OF THE INVENTION

The present invention has been made in view of the above situation in the related art. It is therefore an object of the present invention to provide a method and an apparatus for etching a ruthenium film which can sufficiently etch away an unnecessary ruthenium film formed on or adhering to the peripheral region, especially the no-device-formed region, backside or other portions of a substrate.

Thus, the present invention provides a method for etching a ruthenium film, comprising: etching a ruthenium film formed on a substrate with a chemical liquid having a pH of not less than 12 and an oxidation-reduction potential of not less than 300 mVvsSHE (i.e., 300 mV versus, or as compared to, the SHE, or Standard Hydrogen Electrode). It has been confirmed that the above method can sufficiently etch away a ruthenium film formed on a substrate by sputtering or CVD. In order to secure a practical level of etching rate, it is preferred to use a chemical liquid having a pH of not less than 13 and an oxidation-reduction potential of not less than 500 mVvsSHE. The pH of the chemical liquid is more preferably not less than 14 because when the pH is 13 or less, there is a likelihood of precipitation of insoluble ruthenium dioxide, which will cause particle contamination.

The chemical liquid can be maintained at a pH of not less than 12 by using ammonia, an organic alkali or an alkali hydroxide.

Further, the chemical liquid can be maintained at an oxidation-reduction potential of not less than 300 mVvsSHE by using, for example, a halide oxidant.

Either a strongly alkaline oxidant solution or a mixed solution of an alkali solution and an oxidant solution can be used as the chemical liquid. The strongly alkaline oxidant solution or the mixed solution may be supplied to a predetermined portion of a ruthenium film formed on a substrate so as to etch away the ruthenium film at the predetermined portion.

The strongly alkali oxidant solution may be a solution of a halogenated oxygen acid salt, such as hypochlorite, chlorite, or bromate.

The alkali solution may contain at least one of ammonia, tetramethylammonium hydroxide, and trimethylamine, and the oxidant solution may contain at least one of bromine, iodine, chlorine dioxide, and ozone.

It is possible to supply the alkali solution and the oxidant solution separately to a predetermined portion of a ruthenium film formed on a substrate, and mix both solutions in site, thereby etching away the ruthenium film at the portion where both solutions are mixed.

The present invention provides an apparatus for etching a ruthenium film, comprising: a substrate holder for holding and rotating a substrate; a center nozzle disposed above a central portion of the substrate held by the substrate holder for supplying ultrapure water to a surface of the substrate; and an edge nozzle disposed above the peripheral portion of the substrate held by the substrate holder for supplying a chemical liquid having a pH of not less than 12 and an oxidation-reduction potential of not less than 300 mVvsSHE to the surface of the substrate.

The present invention also provides an apparatus for etching a ruthenium film, comprising: a substrate holder for holding and rotating a substrate; a center nozzle disposed above a central portion of a substrate held by the substrate holder for supplying one of an alkali solution and an oxidant solution to a surface of the substrate; and an edge nozzle disposed above the peripheral portion of the substrate held by the substrate holder for supplying the other one of the alkali solution and the oxidant solution to the surface of the substrate. A mixture of the alkali solution and the oxidant solution has a pH of not less than 12 and an oxidation-reduction potential of 300 mVvsSHE.

The present invention also provides an apparatus for etching a ruthenium film, comprising: a substrate holder for holding and rotating a substrate; a rotatable chemical liquid applicator that can be brought into contact with a bevel region of the substrate held by the substrate holder; and a chemical liquid supply pipe for supplying a chemical liquid having a pH of not less than 12 and an oxidation-reduction potential of not less than 300 mVvsSHE to the chemical liquid applicator.

The present invention further provides an apparatus for etching a ruthenium film, comprising: a substrate holder for holding a front surface of a substrate in a non-contact manner and rotating the substrate; and a back nozzle disposed so as to be directed toward the central portion of a backside of the substrate held by the substrate holder. While flowing an inert gas along the front surface of the substrate, a chemical liquid having a pH of not less than 12 and an oxidation-reduction potential of not less than 300 mVvsSHE is supplied from the back nozzle to the backside of the substrate

BRIEF DESCRIPTION OF THE DRAWINGS

The above and other objects, features, and advantages of the present invention will be apparent from the following description when taken in conjunction with the accompanying drawings which illustrates preferred embodiments of the present invention by way of example, wherein.

DETAILED DESCRIPTION OF THE PREFERRED EMBODIMENTS

Preferred embodiments of the present invention will now be described with reference to the drawings.

Figure 1:
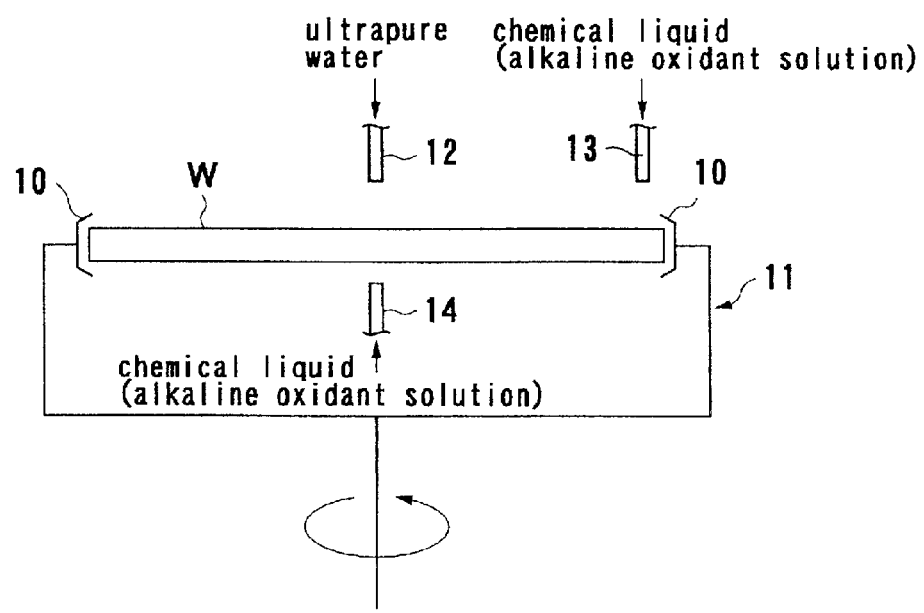
FIG. 1 is a schematic view illustrating a first embodiment of an etching apparatus for etching ruthenium in accordance with the present invention.

FIG. 1 is a schematic view of a first embodiment of an etching apparatus according to the present invention, which can be used for carrying out the method for etching a ruthenium film of the present invention. As shown in FIG. 1, a substrate W, such as a semiconductor wafer, on which a device is formed in the surface region other than the peripheral region, is gripped by a plurality of spin-chucks 10 at circumferential points in the peripheral region. The wafer is thus held horizontally by a substrate holder 11 whereby the substrate W is allowed to rotate horizontally at a high speed.

A center nozzle 12 faces downwardly above the central portion of the front surface of the substrate W held by the substrate holder 11, and an edge nozzle 13 faces downwardly above the peripheral region. Further, a back nozzle 14 faces upwardly beneath the central portion of the backside of the substrate W.

Herein, the "peripheral region" of a substrate means a peripheral region of the substrate in which a circuit is not formed, or a peripheral region of the substrate in which a circuit is formed but which is not finally utilized as a chip. The center nozzle 12 may be disposed at any desired position between above the central portion and above the peripheral region of the front surface of the substrate. However, the supplied liquid from the center nozzle 12 is always supplied onto the central portion of the substrate. The "central portion" of a substrate herein means preferably a 20% diameter area, more preferably a 10% diameter area, around the center of the substrate. The back nozzle 14, likewise, may be disposed at any desired position between beneath the central portion and beneath the peripheral region of the backside of the substrate. However, the supplied liquid from the backside nozzle 14 is preferably supplied to the central portion of the substrate.

The respective nozzles may be disposed in plural numbers according to the object. Further, a fixed nozzle (not shown) may be mounted on the inner surface of the apparatus, e.g. the inner surface of the waterproof cover 21 shown in FIG. 5, in order to supply pure water, deionized water or a chemical liquid (acid solution, alkali solution, surfactant, corrosion inhibitor, etc.) to the substrate, according to the object.

Next, an example of an etching method using this etching apparatus will be described.

First, while the substrate W is being held horizontally by the substrate holder 11 via the spin-chucks 10, the substrate W is horizontally rotated together with the substrate holder 11. While rotating the substrate W, ultrapure water is supplied from the center nozzle 12 to the central portion of the front surface of the substrate, and a chemical liquid (alkaline oxidant solution) having a pH of not less than 12 and an oxidation-reduction potential of not less than 300 mVvsSHE (standard hydrogen electrode potential) is supplied from the edge nozzle 13 to the peripheral region of the substrate W. At the same time, the chemical liquid having a pH of not less than 12 and an oxidation-reduction potential of not less than 300 mVvsSHE is supplied from the back nozzle 14 to the backside of the substrate W.

The chemical liquid may be a strongly alkaline oxidant solution, which is a solution of a hydrogenated oxygen acid salt, such as hypochlorite, chlorite, or bromate. Alternatively, a mixed solution of an alkali solution containing, for example, an organic alkali such as ammonia, tetramethylammonium hydroxide, or trimethylamine, and an oxidant solution containing an oxidant such as bromine, iodine, chlorine dioxide, or ozone, may be used as the chemical liquid.

When the solution of a hydrogenated oxygen acid salt is used, besides using a prepared chemical liquid, it may be synthesized by electrolysis when it is used. With respect to ozone, an ozone water, which is obtained by generating ozone by electric discharge or water electrolysis, and dissolving the ozone in ultrapure water by a gas-dissolving membrane method or a bubbling method, may be used.

The chemical liquid is adjusted to a pH level of not less than 12 by using, for example, ammonia, an organic alkali or an alkali hydroxide, and to an oxidation-reduction potential of not less than 300 mVvsSHE by adding, for example, a halide oxidant. In order to secure a practical level of etching rate, it is preferred to adjust the pH to not less than 13, and the oxidation-reduction potential to not less than 500 mVvsSHE. The pH is more preferably adjusted to not less than 14 because when the pH is 13 or less, there is a likelihood of precipitation of insoluble ruthenium dioxide, which will cause particle contamination.

According to this example, a ruthenium film formed on the peripheral region of the substrate W can be etched by the chemical liquid (alkaline oxidant solution) supplied to the peripheral region, and the range of etching can be controlled to a predetermined edge-cutting width by the ultrapure water supplied to the central portion of the substrate surface. Further, a ruthenium film which has unavoidably adhered to the backside of the substrate W can be removed by the chemical liquid supplied to the backside. After the etching treatment, ultrapure water may be supplied to the front and back surfaces of the substrate for rinsing the remained chemical liquid, according to necessity, followed by spin-drying. The series of process steps from etching to spin-drying may be carried out continuously.

Figure 2:
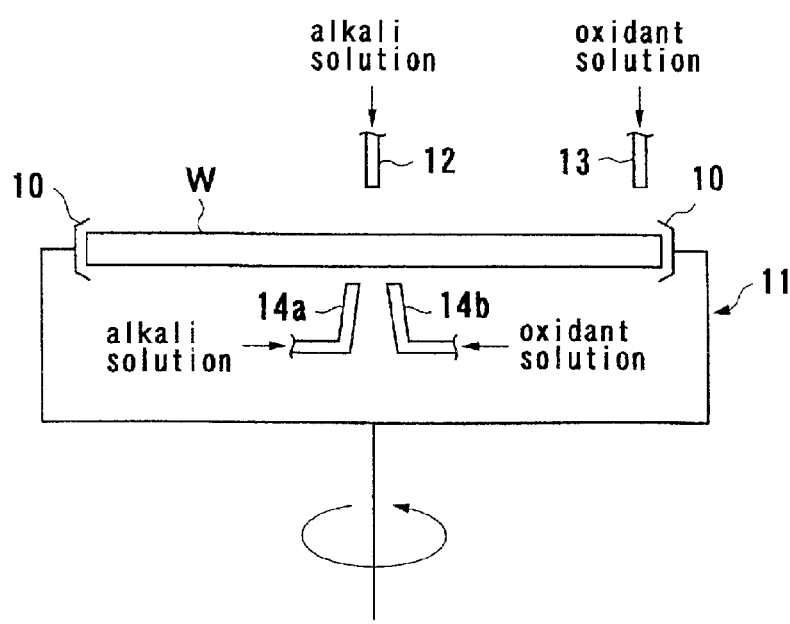
FIG. 2 is a schematic view illustrating a second embodiment of an etching apparatus for etching ruthenium in accordance with the present invention.

FIG. 2 shows a second embodiment of an etching apparatus according to the present invention. According to this etching apparatus, two back nozzles 14a and 14b are disposed upwardly toward the center or its vicinity of the backside of the substrate W. The other construction is the same as the apparatus of FIG. 1.

An example of an etching method using this etching apparatus will now be described. While rotating the substrate W horizontally together with the substrate holder 11 in the same manner as described above, an alkali solution is supplied from the center nozzle 12 to the central portion of the substrate. At the same time, an oxidant solution is supplied from the edge nozzle 13 to the peripheral region of the substrate, thereby mixing both solutions in the peripheral region of the substrate W. The alkali solution to be supplied from the center nozzle 12 and the oxidant solution to be supplied from the edge nozzle 13 should be prepared so that the mixture thereof makes a chemical liquid (alkaline oxidant solution) having a pH of not less than 12 and an oxidation-reduction potential of not less than 300 mVvsSHE.

At the same time, the same alkali solution is supplied from a first back nozzle 14a, and the same oxidant solution is supplied from a second back nozzle 14b, thereby mixing both solutions at the center of the backside of the substrate W.

According to this example, a ruthenium film on the peripheral region of the substrate W is etched by the chemical liquid (alkaline oxidant solution), which is the mixed solution of the alkali solution supplied from the center nozzle 12 and the oxidant solution supplied from the edge nozzle 13, and a ruthenium film on the backside of the substrate W is etched by the chemical liquid (alkaline oxidant solution), which is the mixed solution of the alkali solution supplied from the first back nozzle 14a and the oxidant solution supplied from the second back nozzle 14b.

Figure 3:
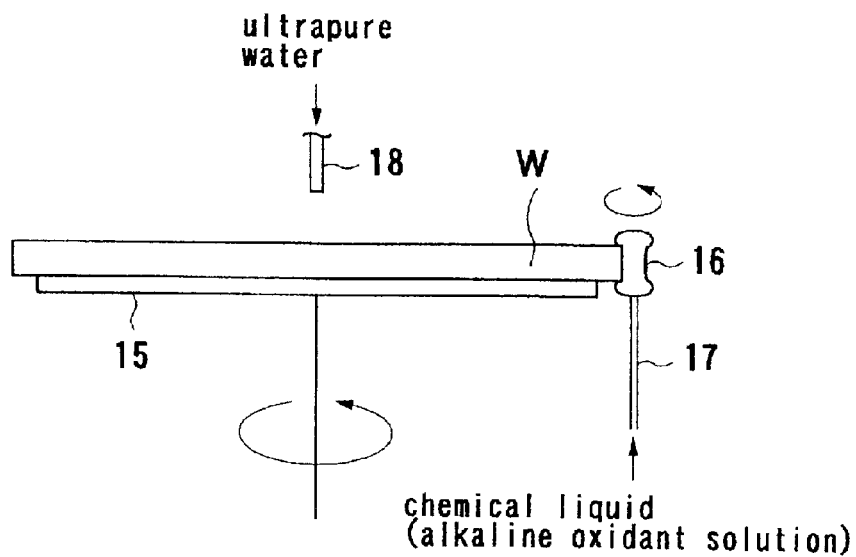
FIG. 3 is a schematic view illustrating a third embodiment of an etching apparatus for etching ruthenium in accordance with the present invention.

FIG. 3 shows a third embodiment of an etching apparatus according to the present invention. This etching apparatus comprises a vacuum-chuck 15 for sucking and holding a substrate, a rotatable sponge roll (chemical liquid applicator) 16, in a generally cylindrical shape, that can be brought into contact with the bevel region of the substrate W held by the vacuum-chuck 15, a chemical liquid supply pipe 17 for supplying a chemical liquid to the sponge roll 16, and a center nozzle 18.

An example of an etching method using this etching apparatus with now be described. While rotating horizontally the substrate W held by the vacuum-chuck 15, ultrapure water is supplied from the center nozzle 18 to the substrate. At the same time, a chemical liquid (alkaline oxidant solution) having a pH of not less than 12 and an oxidation-reduction potential of not less than 300 mVvsSHE is supplied through the chemical liquid pipe 17 to the sponge roll 16.

According to this example, the sponge roll 16 holding the chemical liquid contacts the bevel region and the peripheral region of the substrate W, whereby a ruthenium film formed thereon or adhering thereto is etched. At the same time, the ultrapure water supplied from the center nozzle 18 prevents the chemical liquid from spreading over the upper surface of the substrate. The ruthenium film present in the area of the substrate in contact with the sponge roll 16 is thus etched away.

Figure 4:
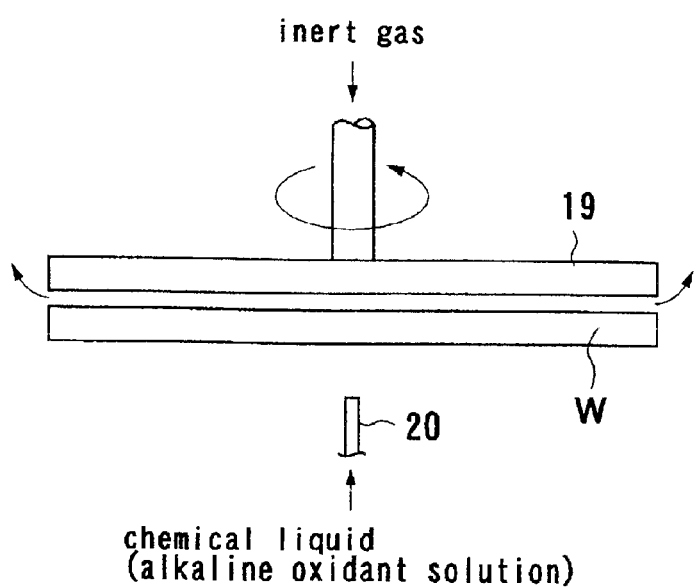
FIG. 4 is a schematic view illustrating a fourth embodiment of an etching apparatus for etching ruthenium in accordance with the present invention.

FIG. 4 shows a fourth embodiment of an etching apparatus according to the present invention. This etching apparatus includes a Bernoulli chuck 19, disposed above the front surface of the substrate W, for holding the substrate W in a non-contact manner, and a back nozzle 20 facing upwardly beneath the center of the backside of the substrate W.

An example of an etching method using this etching apparatus will now be described. An inert gas is introduced into the inside of the Bernoulli chuck 19 to produce a flow of the inert gas between the lower surface of the Bernoulli chuck 19 and the front surface of the substrate W, thereby holding and rotating the substrate W in a noncontact manner. While rotating the substrate W in this manner, a chemical liquid (alkaline oxidant solution) having a pH of not less than 12 and an oxidation-reduction potential of not less than 300 mVvsSHE is supplied from the back nozzle 20 to the backside of the substrate W.

According to this example, a ruthenium film adhering to the backside of the substrate W is etched by the chemical liquid supplied from the back nozzle 20. Further, by controlling the amount of the inert gas flowing between the lower surface of the Bernoulli chuck 19 and the front surface of the substrate W, the amount of the chemical liquid spreading from the backside of the substrate W over to the front surface can be controlled to thereby control the edge-cutting width.

Figure 5:
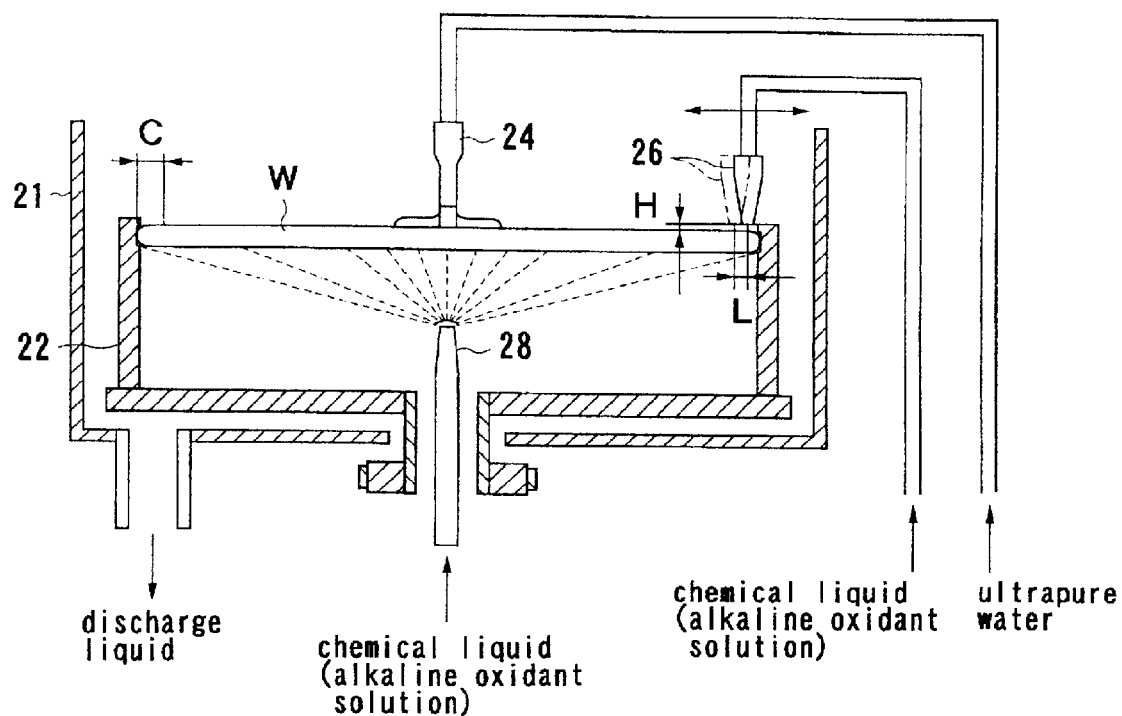
FIG. 5 is a schematic view illustrating a fifth embodiment of an etching apparatus for etching ruthenium in accordance with the present invention.

FIGS. 5 through 9 show a fifth embodiment of an etching apparatus according to the present invention. As shown in FIG. 5, the etching apparatus includes a substrate holder 22 disposed in a bottomed cylindrical water-resistant cover 21 for horizontally holding a substrate W, with the face up, with spin chucks, and rotating the substrate W at a high speed, a central nozzle 24 directed downwardly and positioned above a substantially central portion of the surface of the substrate W held by the substrate holder 22, an edge nozzle 26 directed downwardly and positioned above the periphery of the substrate W, and a back nozzle 28 directed upwardly and positioned below the substantially central portion of the backside of the substrate W.

Figure 6:
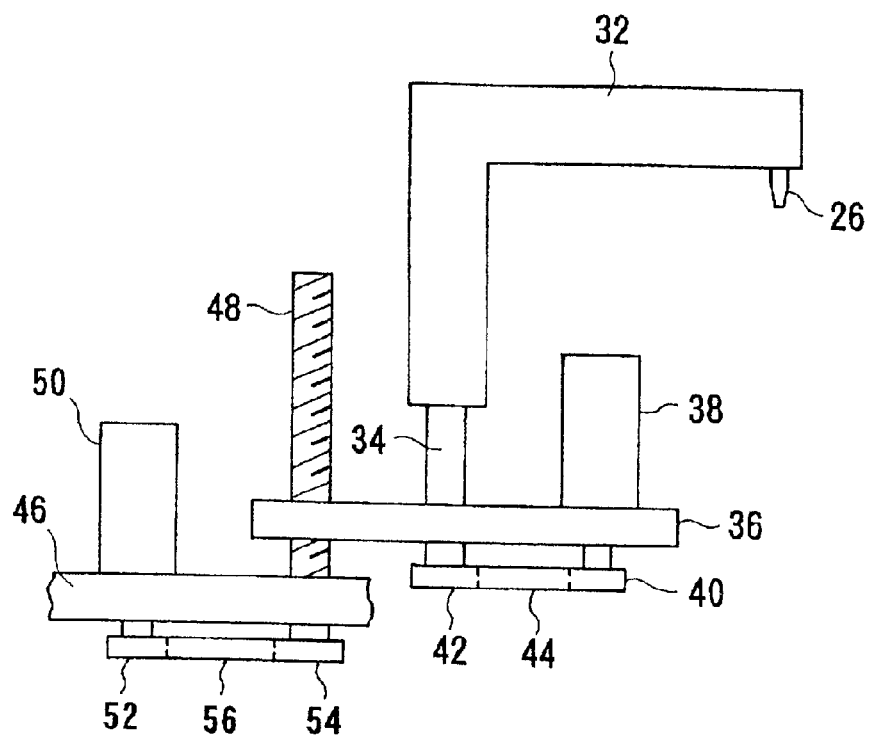
FIG. 6 is a schematic view of a driving mechanism for the edge nozzle of the etching apparatus of FIG. 5.
Figure 9:
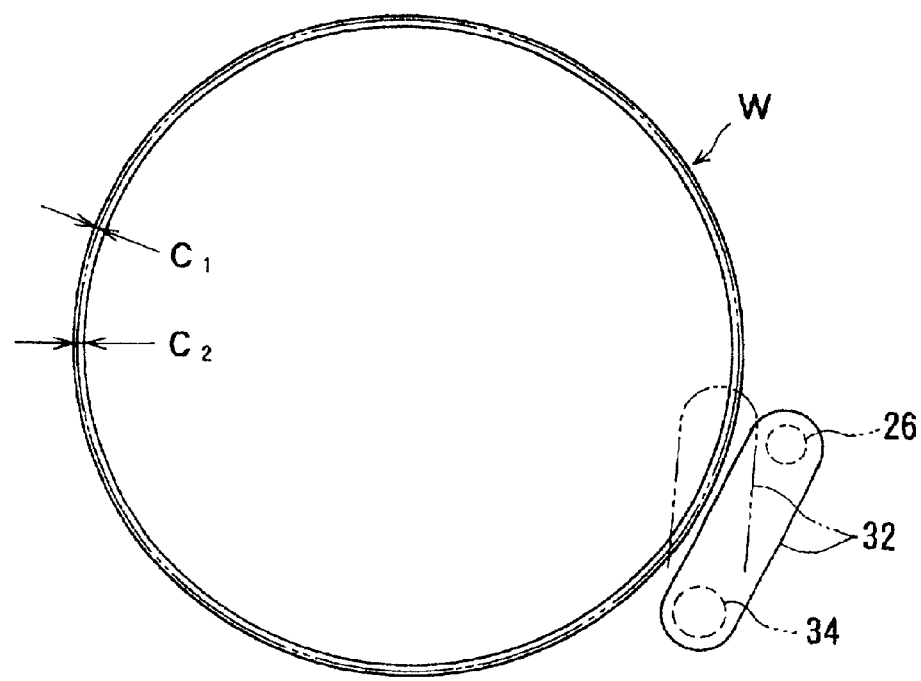
FIG. 9 is a plan view of a substrate illustrating the edge-cutting width according to the etching apparatus of FIG. 5.

As shown in FIG. 6, the edge nozzle 26 is fixedly mounted on a free end of a swing arm 32 that extends horizontally. A vertically extending arm shaft 34 is joined to a proximal end of the swing arm 32 and is rotatably supported on a stage 36. The stage 36 supports a motor 38 for actuating the swing arm 32, and the motor 38 has an output shaft on which a drive pulley 40 is mounted. The arm shaft 34 has a lower end projecting downwardly from the stage 36 and supporting a driven pulley 42. A timing belt 44 is stretched between the drive pulley 40 and the driven pulley 42. As shown in FIG. 9, the swing arm 32 is positioned laterally of the substrate W that is held by the substrate holder 22. When the motor 38 is driven, the swing arm 32 is angularly moved about the arm shaft 34 to displace the edge nozzle 26 from the periphery of the substrate W radially toward the central portion of the substrate W. The movable distance L (see FIG. 5) that the edge nozzle 26 is displaced radially of the substrate W can be controlled by controlling the number of pulses applied to the motor 38.

An externally threaded screw rod 48 is rotatably supported vertically on a mount base 46 and engaged with an internally threaded hole defined in the stage 36. The mount base 46 supports thereon a motor 50 having an output shaft on which a drive pulley 52 is mounted. The screw rod 48 has a lower end projecting downwardly from the mount base 46 and supporting a driven pulley 54. A timing belt 56 is stretched between the drive pulley 52 and the driven pulley 54. When the motor 50 is driven, the screw rod 48 is rotated about its own axis to move the edge nozzle 26 vertically together with the stage 36. The height H (see FIG. 5) from the surface of the substrate W to the lower end of the edge nozzle 26 can be controlled by controlling the number of pulses applied to the motor 50.

Figure 7:
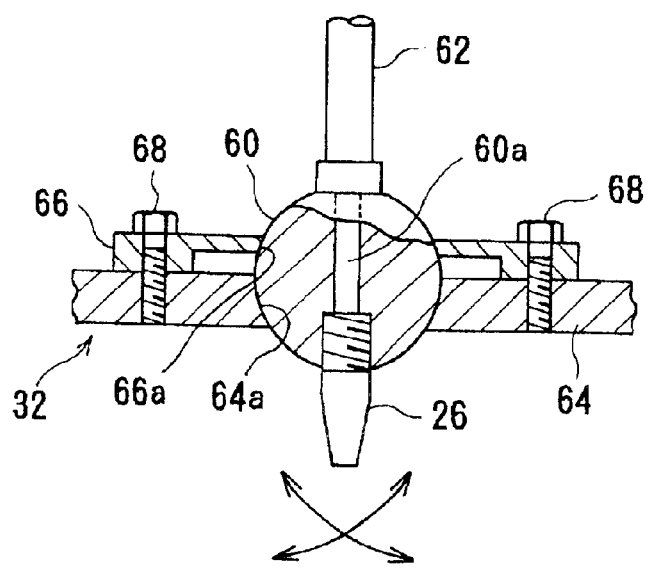
FIG. 7 is a cross-sectional detail view of the fixed portion of the edge nozzle of the etching apparatus of FIG. 5.

As shown in FIG. 7, the edge nozzle 26 is connected to a ball 60 having a chemical passage 60a defined therein which communicates with a chemical tube 62. The ball 60 is gripped between a frame plate 64 of the swing arm 32 and an attachment plate 66 that is fastened to the frame plate 64 by bolts 68. The frame plate 64 and the attachment plate 66 have respective through holes 64a, 66b defined therein by partly spherical surfaces which are complementary in shape and held in abutment against the spherical surface of the ball 60. When the bolts 68 are loosened, the ball 60 freely rotates in the through holes 64a, 66b in the frame plate 64 and the attachment plate 66 for thereby directing the edge nozzle 26 as desired. When the edge nozzle 26 is directed as desired, the bolts 68 are tightened to grip the ball 60 with the frame plate 64 and the attachment plate 66.

Figure 8A:
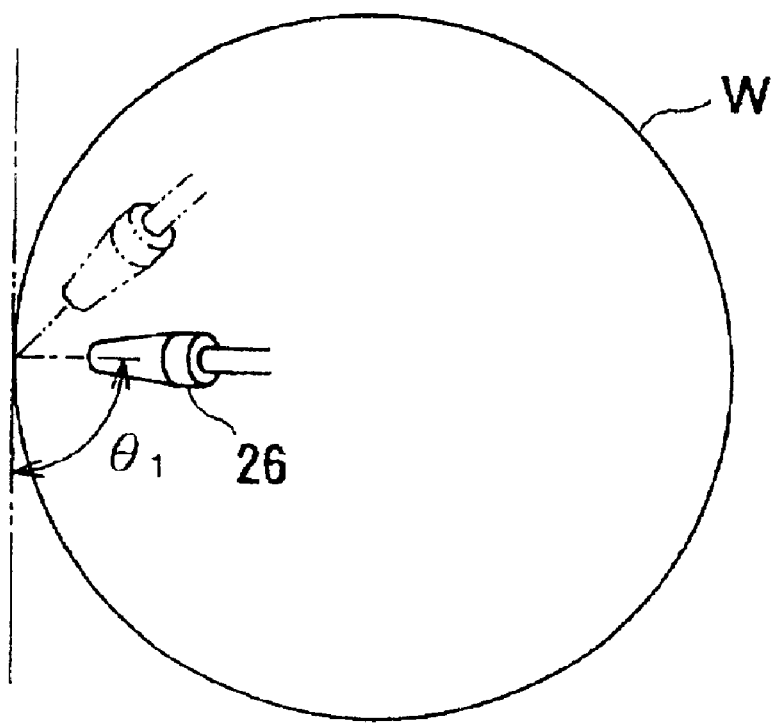
FIG. 8A is a plan view illustrating the direction (angle) of the edge nozzle of the etching apparatus of FIG. 5 to the plane of a substrate.
Figure 8B:
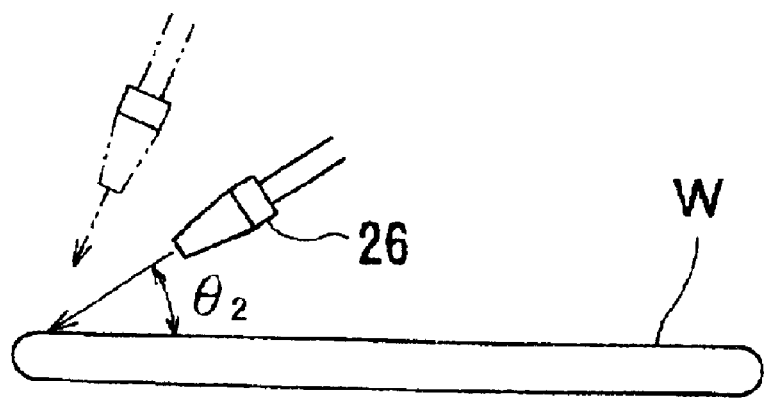
FIG. 8B is a front view illustrating the direction (angle) of the edge nozzle of the etching apparatus of FIG. 5 to the plane of a substrate.

FIG. 8A shows the angle $\theta_1$ formed between an extension line of a line defined as the projection of the liquid ejected from the edge nozzle 26 onto the surface of the substrate W and a tangential line to the outer circumference of the substrate W at an intersection point with the extension line. FIG. 8B shows the angle $\theta_2$ formed between the liquid ejected from the edge nozzle 26 and the surface of the substrate W. By orienting the edge nozzle 26 as described above, the angles $\theta_1$, $\theta_2$ can easily be adjusted to prevent the liquid ejected from the edge nozzle 26 from being scattered from the periphery of the substrate W and also to produce a good etching configuration. The angle $\theta_1$ can be adjusted within the range from 0 to 180°, preferably from 70 to 110°, and more preferably from 80 to 100°. The angle $\theta_2$ can be adjusted within the range from 0 to 90°, preferably from 10 to 60°, and more preferably from 35 to 55°.

If the edge nozzle 26 is oriented obliquely to the surface of the substrate W, then an edge cutting width C (see FIG. 5) can be varied by varying the height H of the edge nozzle 26. For example, if the edge cutting width C is 5 mm when the angle $\theta_2$ is 45° and the height H is 15 mm, then the edge cutting width C can be reduced by 1 mm by increasing the height H by 1 mm. Therefore, insofar as the substrate W is rotated at a rotational speed large enough to prevent the liquid from sneaking from the backside to the surface of the substrate W, then the edge cutting width C can be determined only by varying the height H of the edge nozzle 26. The edge cutting width C can be set freely within a range of edge cutting widths $C_1$–$C_2$ (=2–5 mm) shown in FIG. 9 for removing a copper film present in the edge cutting width C. If the edge nozzle 26 is oriented vertically, as shown in FIG. 5, the edge cutting width C may be adjusted as described above based on the movable distance L that the edge nozzle 26 is displaced radially of the substrate W.

Figure 10:
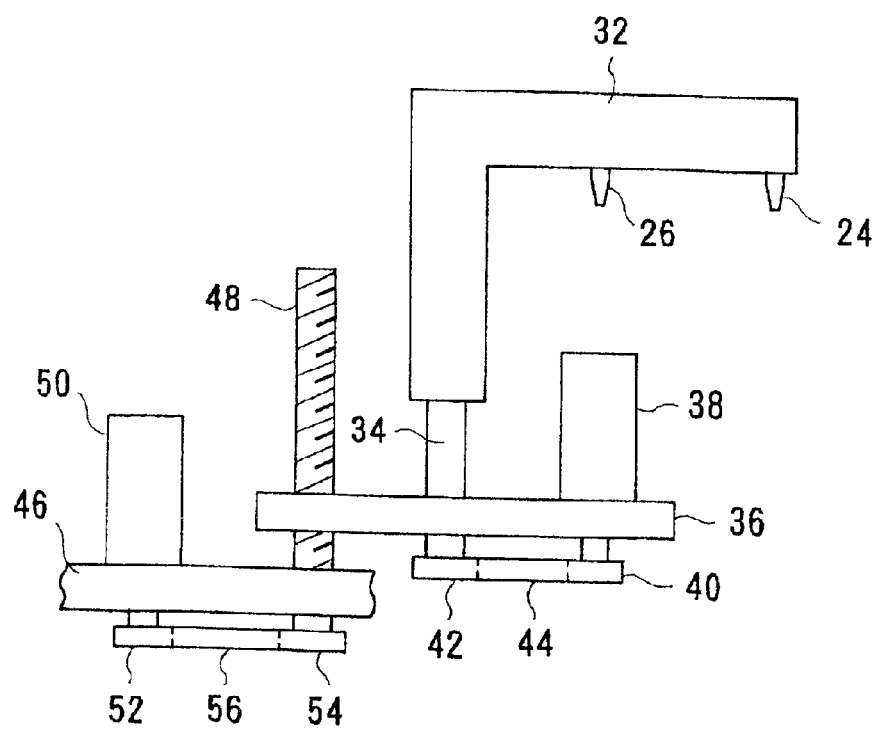
FIG. 10 is a schematic of another driving mechanism that simultaneously moves the center nozzle and the edge nozzle of the etching apparatus of FIG. 5.

As shown in FIG. 10, the central nozzle 24 may be mounted on the free end of the swing arm 32, and the edge nozzle 26 may be mounted on a longitudinally intermediate portion of the swing arm 32. With the modification shown in FIG. 10, when the swing arm 32 is moved, both the central nozzle 24 and the edge nozzle 26 are simultaneously moved.

According to the etching apparatus, the position of the edge nozzle 26 is adjusted freely by the height H of the edge nozzle 26 from the surface of the substrate W, the angle $\theta_2$ formed between the liquid ejected from the edge nozzle 26 and the surface of the substrate W, and the angle $\theta_1$ formed between the extension line of the line defined as the projection of the liquid ejected from the edge nozzle 26 onto the surface of the substrate W and the tangential line to the outer circumference of the substrate W at the intersection point with the extension line. Thus, the edge cutting width C is set depending on the size of the substrate W and the purpose for which the substrate W will be used so as to prevent the liquid ejected from the edge nozzle from being scattered and also to produce a good etching configuration.

An etching method using this etching apparatus is the same as the etching apparatus shown in FIG. 1, basically.

In any of the embodiments described above, after the removal by etching of the ruthenium film on the peripheral region and the backside of the substrate, hydrofluoric acid and an oxidant solution may be supplied, either separately or as a mixed solution according to the construction of the apparatus, to the underlying barrier film (e.g., a titanium nitride film) to complete the purification of the surface of the barrier film. Ozone water, nitric acid, or hydrogen peroxide may be used as the oxidant solution.

EXAMPLE 1

A substrate, in which a 30 nm ruthenium film had been formed by CVD on a titanium nitride barrier film, was set in the etching apparatus shown in FIG. 1. While rotating the substrate at a rotational speed of 500 rpm, an ammonium hypochlorite solution of 1% effective chlorine concentration, as the chemical liquid (alkaline oxidant solution), was supplied to the peripheral region of the front surface of the substrate and also to the backside, respectively at a rate of 100 cc/min, and ultrapure water was supplied at a rate of 100 cc/min to the central portion of the front surface. By performing the treatment for 4 minutes, the ruthenium on the peripheral region was completely removed, and the ruthenium on the backside was removed to an amount of $10^{10}$ atms/cm$^2$ or less.

EXAMPLE 2

The same substrate as used in Example 1 was set in the etching apparatus shown in FIG. 2. While rotating the substrate at a rotational speed of 500 rpm, 0.1% ammonia water, as the alkali solution, was supplied at a rate of 1 L/min to the central portion of the front surface of the substrate, ozone water of an ozone concentration of 50 mg/L, as the oxidant solution, was supplied at a rate of 20 cc/min to the peripheral region, and the ammonia water and the ozone water were supplied respectively at a rate of 500 ml/min to the backside. After performing the treatment for 10 minutes, the same results as in Example 1 were obtained. Since the ozone water is rapidly degraded by a strong alkali, it is undesirable to previously mix the ozone water and the ammonia water before supplying them to the substrate.

EXAMPLE 3

The same substrate as used in Example 1 was set in the etching apparatus shown in FIG. 3. While rotating the substrate at a rotational speed of 20 rpm, a sodium hypochlorite solution of 1% effective chlorine concentration, as the chemical liquid (alkaline oxidant solution), was supplied at a rate of 10 cc/min to the sponge roll that was in pressure contact with the periphery of the substrate. By performing the treatment for 5 minutes, the ruthenium film on the peripheral region of the substrate was completely removed.

EXAMPLE 4

The same substrate as used in Example 1 was set in the etching apparatus shown in FIG. 4. While rotating the substrate at a rotational speed of 400 rpm, a mixed solution of a 0.2% tetramethylammonium hydroxide solution and 1% bromine water was supplied at a rate of 2 L/min to the backside of the substrate. By performing the treatment for 7 minutes, the ruthenium on the backside was etched away to an amount of $10^{10}$ atms/cm$^2$ or less.

According to the present invention, as described above, a ruthenium film formed on or adhering to the peripheral region, especially the no-device-formed region, backside or other portions of a substrate, can be sufficiently etched away.

Although certain preferred embodiments of the present invention have been shown and described in detail, it should be understood that various changes and modifications may be made therein without departing from the scope of the appended claims.

What is claimed is:

1. A method for etching a ruthenium film, comprising:
    etching a ruthenium film formed on a substrate with a chemical liquid having a pH of not less than 12 and an oxidation-reduction potential of not less than 300 mVvsSHE.

2. The method according to claim 1, wherein said chemical liquid is maintained at a pH of not less than 12 by using ammonia, an organic alkali or an alkali hydroxide.

3. The method according to claim 1, wherein said chemical liquid is maintained at an oxidation-reduction potential of not less than 300 mVvsSHE by using a halide oxidant.

4. The method according to claim 1, wherein said chemical liquid comprises an alkaline oxidant solution or a mixed solution of an alkali solution and an oxidant solution, and said alkaline oxidant solution or said mixed solution is supplied to a predetermined portion of the ruthenium film formed on the substrate.

5. The method according to claim 4, wherein said alkaline oxidant solution comprises a solution of a halogenated oxygen acid salt selected from hypochlorite, chlorite, and bromate.

6. The method according to claim 4, wherein said alkali solution contains at least one of ammonia, tetramethylammonium hydroxide, and trimethylamine;
    wherein said oxidant solution contains at least one of bromine, iodine, chlorine dioxide, and ozone.

7. The method according to claim 1, further comprising;
    supplying an alkali solution and an oxidant solution separately to a predetermined portion of the ruthenium film formed on the substrate; and
    mixing said alkali solution and said oxidant solution at said predetermined portion to prepare said chemical liquid.

8. The method according to claim 7, wherein said alkali solution contains at least one of ammonia, tetramethylammonium hydroxide, and trimethylamine;
    wherein said oxidant solution contains at least one of bromine, iodine, chlorine dioxide, and ozone.

9. The method according to claim 1, wherein said etching comprises:
    rotating said substrate while simultaneously supplying water to a central portion of a first side of said substrate, simultaneously supplying said chemical liquid to a peripheral region of said first side of said substrate, and simultaneously supplying said chemical liquid to a central portion of a second side of said substrate opposite said first side, said ruthenium film being formed at said first side of said substrate.

10. The method according to claim 1, wherein said etching comprises:
    rotating said substrate while simultaneously supplying water to a central portion of a first side of said substrate, and simultaneously supplying said chemical liquid to a peripheral region of said substrate via a rotatable sponge roll, said ruthenium film being formed at said first side of said substrate.

11. The method according to claim 1, wherein said etching comprises:
    rotating said substrate by producing a flow of inert gas from a lower surface of a Bernoulli chuck toward a first side of said substrate, said ruthenium film being formed at said first side of said substrate; and
    simultaneously supplying said chemical liquid to a second side of said substrate opposite said first side.

* * * * *